United States Patent
Washburn et al.

(10) Patent No.: US 6,266,262 B1
(45) Date of Patent: Jul. 24, 2001

(54) ENHANCED BINARY CONTENT ADDRESSABLE MEMORY FOR LONGEST PREFIX ADDRESS MATCHING

(75) Inventors: James G. Washburn, Palo Alto; Jayan R. Ramankutty, Fremont; Ajit K. Medhekar, San Jose, all of CA (US)

(73) Assignee: Lara Technology, Inc., San Jose, CA (US)

( * ) Notice: Subject to any disclaimer, the term of this patent is extended or adjusted under 35 U.S.C. 154(b) by 0 days.

(21) Appl. No.: 09/187,285

(22) Filed: Nov. 5, 1998

(51) Int. Cl.[7] .................................................. G11C 15/04
(52) U.S. Cl. ................. 365/49; 365/189.02; 365/189.07; 365/190
(58) Field of Search ................. 365/49, 189.07, 365/189.02, 189.12, 190

(56) References Cited

U.S. PATENT DOCUMENTS

| | | | |
|---|---|---|---|
| 3,675,211 | 7/1972 | Raviv | 341/67 |
| 4,791,606 | 12/1988 | Threewitt et al. | 365/49 |
| 4,845,668 | 7/1989 | Sano et al. | 365/49 |
| 4,928,260 | 5/1990 | Chuang et al. | 365/49 |
| 4,975,873 | 12/1990 | Nakabayashi et al. | 365/49 |
| 5,014,195 | 5/1991 | Farrell et al. | 711/128 |
| 5,383,146 | 1/1995 | Threewitt | 365/49 |

OTHER PUBLICATIONS

McAuley, A. and Francis, P., "Fast Routing Table Lookup Using CAMs," Proceedings IEEE INFOCOM, 1993, pp. 1382–1391.

Gupta et al., "Routing Lookups in Hardware at Memory Access Speeds," Proceedings of the IEEE INFOCOM, 1998.

*Primary Examiner*—Andrew Q. Tran
(74) *Attorney, Agent, or Firm*—Bradley T. Sako (57) ABSTRACT

A modified binary content addressable memory (CAM) (700) having a fast variable prefix matching capability is disclosed. The modified CAM (700) includes modified CAM cells (702(0,0) to 702(n,m)), each of which includes a store/compare circuit (704(0,0) to 704(n,m)) for storing a data value and comparing the data value to a comparand value. In addition, each modified CAM cell (702(0,0) to 702(n,m)) further includes a multiplexer (MUX) circuit (706(0,0) to 706(n,m)). Each MUX circuit (706(0,0) to 706(n,m)) receives a non-shifted comparand value from a modified CAM cell of a previous row and same column, and a shifted comparand value from a modified CAM cell of the previous row and an adjacent column. The MUX circuits (706(0,0) to 706(n,m)) enable a comparand value to be shifted as it is applied to consecutive data values.

20 Claims, 5 Drawing Sheets

| LOCATION | VALUE | PREFIX(MASK) |
|---|---|---|
| 0 | A3 A2 A1 A0 | 1 1 1 1 |
| 1 | B3 B2 B1 B0 | 1 1 1 1 |
| 2 | C3 C2 C1 C0 | 1 1 1 1 |
| 3 | D3 D2 D1 D0 | 1 1 1 0 |
| 4 | E3 E2 E1 E0 | 1 1 0 0 |
| 5 | F3 F2 F1 F0 | 1 1 0 0 |
| 6 | G3 G2 G1 G0 | 1 0 0 0 |
| 7 | H3 H2 H1 H0 | 1 0 0 0 |

ENHANCED BINARY CONTENT ADDRESSABLE MEMORY FOR LONGEST PREFIX ADDRESS MATCHING

TECHNICAL FIELD

The present invention relates generally to content addressable memories (CAMs) and more particularly to a novel CAM structure that allows for matching of variable length input data values.

BACKGROUND OF THE INVENTION

Computer networks continue to proliferate. As a result, data traffic among networks continues to increase, placing ever-increasing demands on the ability of network structures to transfer data between networks. Network data is usually transferred in data units referred to as "packets" (or datagrams) that are transmitted from a source machine and eventually received by a destination machine. While network data transfers may appear transparent to both the source machine and the destination machine, in actuality, the data packets are usually transferred between intermediate stages (referred to as "hops") by machines referred to as "routers." A router will receive a packet, examine destination information within the packet, and from this destination information, "forward" the packet to a "next" hop destination. In this manner, data is forwarded by one or more hops, and eventually arrives at the desired destination. The function of examining a destination address and determining next hop information is often referred to as "address matching."

Routing functions rely on an underlying standardization in the data packet format and transmission method (protocols). One of the most prevalent protocols is the internet protocol (IP). IP serves to route a given packet from a source to a destination. To accomplish this function an IP data packet will include an initial portion (header) that includes, among other information fields, a source address and a destination address. As noted above, it is the destination address that is utilized by a routing machine to transfer a data packet to its next hop or final destination. To accomplish the routing function, a router will typically include a "look-up" table that includes next hop information corresponding to particular destination addresses. The router examines the destination address of an incoming packet, looks up the next hop information, and uses the next hop information to forward the packet onward toward its destination.

Routing functions can be performed by general purpose processors that run a routing algorithm. Such an approach can result in limited throughput of data packets, be expensive in terms of component cost, and require considerable area to implement.

One way to address the need for faster routers is to fabricate an integrated circuit that is specialized to perform routing tasks. Such application specific integrated circuits (ASICs) are designed to perform particular routing functions such as address matching. Unfortunately, because ASICs are custom manufactured products, they can also be expensive to manufacture.

One type of device that is particularly suitable for router address matching functions, is a content addressable memory (CAM), also referred to as an "associative memory." A CAM includes a number of data storage locations, each of which can be accessed by a corresponding address. The order in which the data values are stored varies according to the type of CAM. As just one example, in a typical "binary" CAM, data can be stored in the first available "empty" location. Empty locations are distinguished from "full" (or valid) locations by a status bit associated with each storage location.

Valid locations can then be addressed according to the contents (data values) that they store. A data value is loaded into a comparand register. The value within the comparand register can then be compared to the data values within each valid location. In the event the value within the comparand register matches the value of a storage location, a match signal for the matching storage location will be generated. In the event there is more than one match, one match from the multiple matches will be selected according to predetermined priority criteria. The address corresponding to the match location can then be made available.

Figure 1:
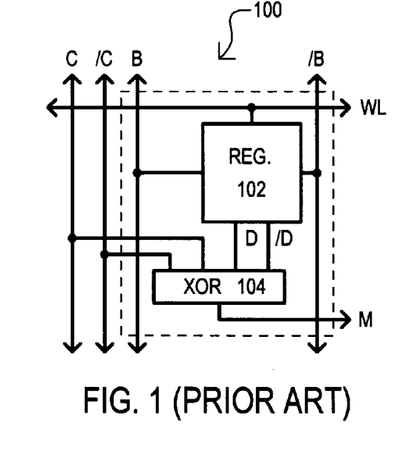
FIG. 1 is a block schematic diagram of a prior art binary content addressable memory (CAM) cell.

Referring now to FIG. 1, a prior art "binary" CAM cell is set forth in block schematic diagram and designated by the general reference character 100. The CAM cell 100 is shown to include a storage register 102 that stores a data value. The register 102 can be accessed (for a read or write operation) by activating a word line WL. In a write operation, data would be placed on a pair of complementary bit lines (B and /B) to force a logic value into the register 102. In a read operation, the register 102 would place a data value on the bit lines (B and /B). It is understood that the word line WL is common to a number of other CAM cells within the same row, and the bit line pair (BL and /BL) is common to a number of other CAM cells within the same column.

As shown in FIG. 1, the CAM cell 100 also includes a compare circuit 104 that receives the data values stored within the register 102 by way of data lines D and /D. In addition, the compare circuit 104 also receives complementary comparand values, by way of compare lines C and /C. The compare circuit 104 compares the data line values and comparand values, and in the event the values are the same, activates a match indication on match line M. In the particular prior art example of FIG. 1, the compare circuit 104 is an exclusive OR (XOR) circuit.

Figure 2:
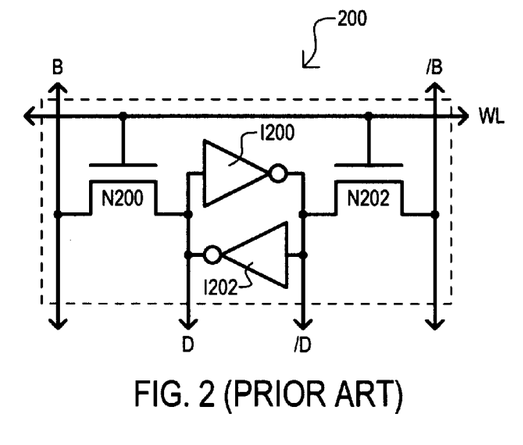
FIG. 2 is a detailed schematic diagram of a prior art register circuit.

Referring now to FIG. 2, a prior art register that may be used as the register 102, is set forth in a block schematic diagram. The register is designated by the general reference character 200 and includes a pair of cross-coupled inverters I200 and I202. The inverters (I200 and I202) are "cross-coupled" in that the output of inverter I200 is coupled to the input of inverter I202, and vice versa. The outputs of the inverters (I200 and I202) provide the data values on lines D and /D. Thus, the node formed at the output of inverter I202 and the input of inverter I200 can be considered a data node. The inverters (I200 and I202) provide the storage function of the register 200, and are accessed by two n-channel pass transistors N200 and N202. Transistor N200 has a source-drain path coupled between bit line B and the input of inverter I200. Transistor N202 has a source-drain path coupled between bit line /B and the input of inverter I202. The gates of transistors N200 and N202 are commonly coupled to a word line WL.

Figure 3:
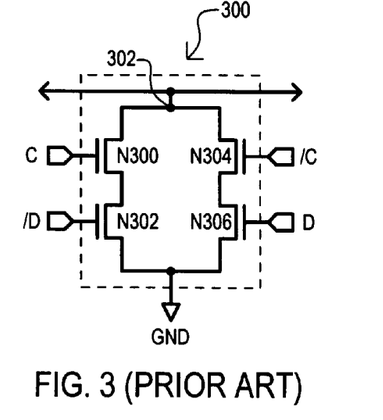
FIG. 3 is a detailed schematic diagram of a prior art compare circuit.

FIG. 3 sets forth a prior art compare circuit 300 that may be used as the compare circuit 104 set forth in FIG. 1. The compare circuit is an XOR circuit that includes a first pair of n-channel transistors N300 and N302 arranged in series between a match node 302 and a ground voltage GND. The gate of transistor N300 receives a comparand value C. The gate of transistor N302 receives the complementary data value /D. The compare circuit 300 further includes a second pair of transistors N304 and N306 arranged in series between the match node 302 and the GND voltage. The gate of transistor N304 receives a complementary comparand value /C and the gate of transistor N306 receives a data value D. In the event the comparand values (C and /C) are different than the data values (D and /D, respectively), the match node 302 will be discharged to the GND voltage. However, in the event the comparand values (C and /C) are the same as the data values (D and /D), the match node 302 will remain at a precharged level, indicating a match.

As noted above, a binary CAM can provide a rapid look-up function for an IP address. However, this is only true when the look-up function is for IP addresses having the same number of bits. Unfortunately, IP addresses can have prefixes of variable length. For example, two addresses are set forth below. The prefix values that must be matched are shown as binary values (either 0 or 1). The remaining portion of the IP address that does not have to be matched is represented by a series of Xs.

```
11110000 10XXXXXX XXXXXXXX XXXXXXXX    (address 1)
10101010 01010101 100XXXXX XXXXXXXX    (address 2)
```

Thus, the first address requires a router to find a match with a 10-bit prefix, while the second address requires a match with a 19-bit prefix. For proper routing of data packets, a router must perform a longest prefix matching function.

Figure 4:
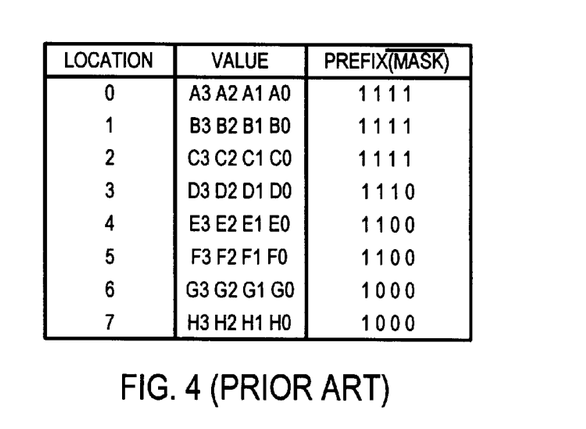
FIG. 4 is a table illustrating a prior art ternary CAM.

A prior art way to address longest prefix matching is to utilize a "ternary" or "tertiary" CAM. In a ternary CAM, a data value is stored according to the length of its prefix. This is accomplished by providing a prefix (or mask) bit for each bit of data. An example of ternary CAM storage arrangement is illustrated by a table set forth in FIG. 4. The table of FIG. 4 describes a ternary CAM having eight locations, each of which can store a data word of four bits. Longest prefix matching is required, thus the ternary CAM is required to compare either all four bits, the first three bits, the first two bits or the first bit of the data words. To indicate which bits comprise a prefix, the ternary CAM includes prefix data corresponding to each storage locations. If reference is made to FIG. 4, it is shown that data location "0" stores the four-bit data value A3 A2 A1 A0. Corresponding to the data location 0 is the prefix value 1111. This prefix value indicates that all four bits are to be compared with a comparand value. In contrast, data location "5," which stores the four-bit data value F3 F2 F1 F0, has a prefix value of 1100. This prefix value indicates that the first two bits F3 and F2 are to be compared with a comparand value.

To better understand the operation of the preferred embodiment, and to emphasize the advantageous features of the preferred embodiment, a prior art ternary CAM cell will be described. The prior art ternary CAM cell is set forth in FIG. 5 and designated by the general reference character 500. The ternary CAM memory cell 500 includes some of the same circuit constituents as the binary CAM memory cell of FIG. 1. Namely, the ternary CAM memory cell 500 includes a data register 502 and a compare circuit 504. The data register 502 has the same general circuit structure as that set forth in FIG. 2. Similarly, the compare circuit 504 is an XOR circuit such as that set forth in FIG. 3. The data register 502 is coupled to a complementary bit line pair (B and /B) by a value word line (VWL). The compare circuit 504 receives the data value stored by the data register 502 and a comparand value (C and /C), and compares the two values to generate a pre-match value (PMATCH).

To accomplish the variable prefix matching function, the ternary CAM cell 500 further includes a mask register 506 and a mask circuit 508. The mask register 506 stores the match value that corresponds to the data value in the data register 502. For example, referring back to FIG. 4, the prefix value corresponding to the G3 value stored in location 6 is "1." The prefix value is the inverse of the mask value. Thus, if the data register 502 stores the G3 value, the mask register 506 would store a "0" value (i.e., the entire mask value for the data word at storage location 6 would be 0111, the inverse of the value shown in the table of FIG. 5).

Figures 5, 6:
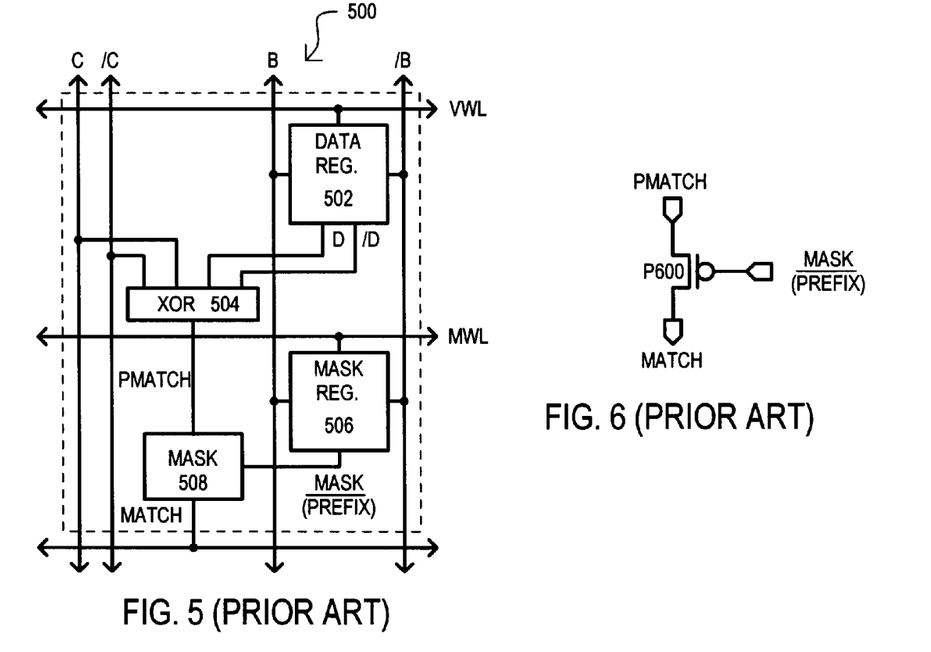
FIG. 5 is a block schematic diagram of a prior art ternary CAM cell.
FIG. 6 is a detailed schematic diagram of a prior art mask circuit.

In the prior art arrangement of FIG. 5, the mask register 506 has the same structure as the register set forth in FIG. 2. Accordingly, the mask value can be written into the mask register 506, by way of bit line pair (B and /B), by activating a corresponding mask word line 506. The value stored by the mask register 506 is supplied to the mask circuit 508. The mask circuit provides a match value MATCH depending upon the mask value MASK. In the event the MASK value is low (indicating that the stored data bit is a prefix bit, and so should be compared) the PMATCH value is provided as an output by the mask circuit 508 to generate the MATCH value. Conversely, when the MASK value is high (indicating that the stored data bit is not part of the prefix, and so should not be compared) the PMATCH value is prevented from being passed through the mask circuit 508.

FIG. 6 is a schematic diagram illustrating the mask circuit of the ternary CAM 500 of FIG. 5. The mask circuit 600 is shown to be a p-channel metal-oxide-semiconductor (MOS) transistor P600 having a source-drain path coupled between the PMATCH signal and the MATCH signal. The gate of transistor P600 is driven by the MASK (/PREFIX) signal.

While the ternary CAM 500 provides for parallel, variable prefix matching, if reference is made to FIGS. 2–6, it is shown that a single ternary CAM cell requires 17 transistors. This assumes that the inverters used within the registers 502 are complementary MOS (CMOS) inverters, and thus each include two transistors. In contrast, the binary CAM 100 includes 10 transistors. Accordingly, the implementation of a conventional ternary CAM 500 requires considerable area, as there can be thousands, or possibly millions of such cells within a CAM. Area in any semiconductor device is a premium commodity, as larger areas can translate directly into increased manufacturing costs. Thus, conventional ternary CAMs can be an expensive and complex solution to the longest prefix matching problem.

It would be desirable to arrive at some sort of approach to longest prefix matching that does not have the drawbacks associated with ternary CAMs. If such an approach could provide rapid variable prefix matching functions, without requiring excessive area to implement, an acute need in the network hardware field would be met.

SUMMARY OF THE INVENTION

According to the preferred embodiment, a modified binary content addressable memory (CAM) is provided that can perform variable prefix matching. The modified CAM includes a number of modified CAM cells that each include a data storage portion, that stores data, and a compare portion, that compares the stored data with a comparand value. Cells of the modified CAM further include multiplexer circuits that supply the comparand value to the compare portion. The multiplexer circuits enable a comparand value to be shifted in position as it is applied to the various data locations within the array. A shift bit is stored that corresponds to each data value. When the shift bit has one value, the comparand is not shifted as it is applied to the next consecutive data value. When the shift bit has another value, the comparand is shifted by one bit as it is applied to the next consecutive data value.

To accomplish variable prefix matching, the preferred embodiment modified CAM loads data values in the same order as a conventional ternary CAM, with the highest prefix values preceding the lowest prefix values. Unlike a conventional ternary CAM, in the modified CAM, data values are shifted according to prefix length with shorter prefixes being shifted to the right and preceded by one or more "0s."

According to one aspect of the preferred embodiment, the CAM cells are formed using complementary transistors.

According to another aspect of the preferred embodiment, the CAM cells are formed using 14 transistors.

According to another aspect of the preferred embodiment, dummy data values are utilized to introduce a shift in the comparand value in the event one data prefix value is shorter than a previous data prefix value by more than one bit.

DETAILED DESCRIPTION OF THE EMBODIMENTS

The preferred embodiment is a modified binary content addressable memory (CAM) that is capable of executing a longest prefix matching operation. The preferred embodiment will be initially described in a series of simplified block schematic diagram views that illustrate how a comparand data value is shifted through the CAM array to provide the prefix matching function. The structure of a single CAM cell according to the preferred embodiment will then be described and its operation discussed in detail.

Figure 7:
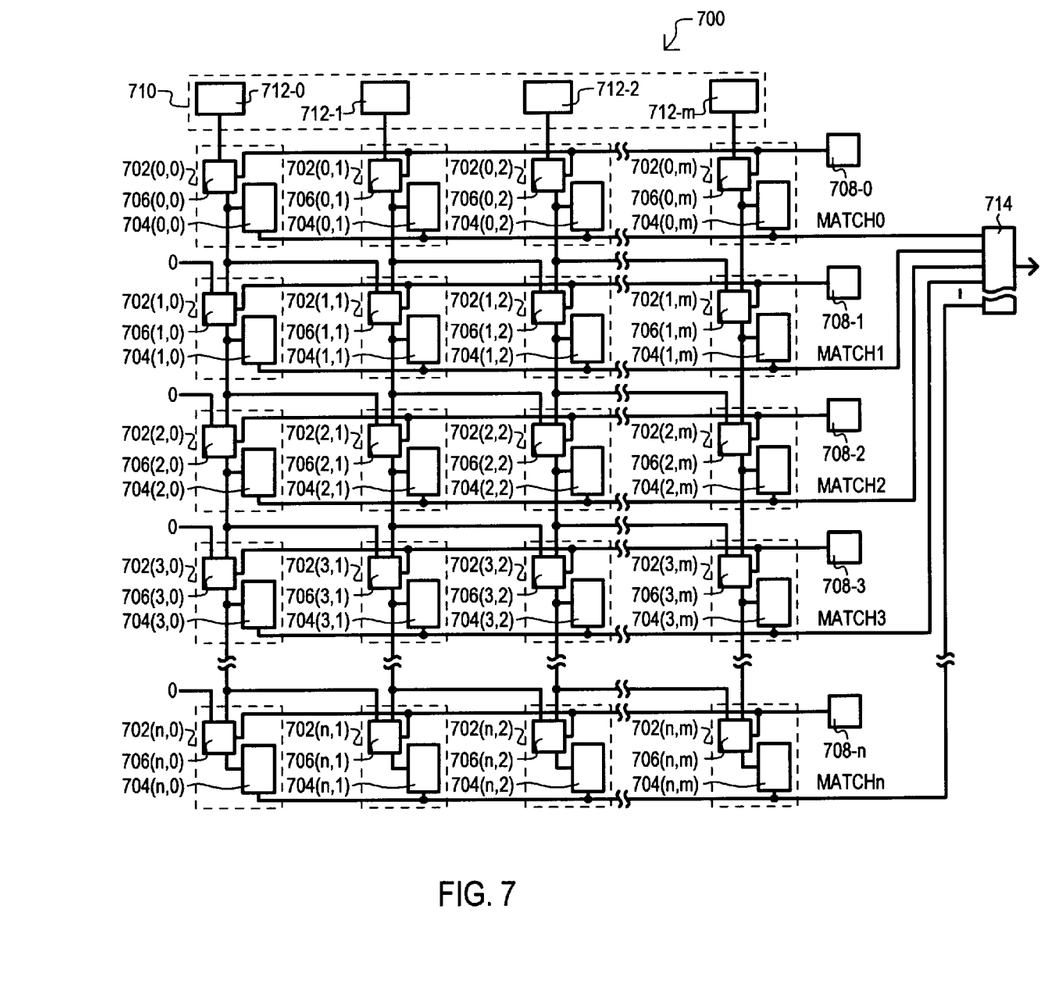
FIG. 7 is a block schematic of a modified binary CAM according to the preferred embodiment.

Referring now to FIG. 7, the preferred embodiment is set forth in a simplified schematic diagram. The preferred embodiment is designated by the general reference character 700, and is shown to include an array of modified CAM cells that includes "m" cells per row and "n" cells per column. The modified CAM cells are identified by their position within the array, and so are shown as items 702(0,0) to 702(n,m). In this arrangement, the modified CAM cells of the same row (e.g., 702(0,0) to 702(0,m)) form a data word. The rows of the modified CAM 700 represent a particular data word order, with the rows having a common column value of "0" representing the first data word of an order (and thus storing a longest prefix). The last data word of an order, those rows having a common column value of "n," represent the last data word of an order (and thus stores the shortest prefix—or does not store valid data).

A match indication for each data word in the CAM 700 is provided by a corresponding set of match lines (MATCH0–MATCHn). The match lines (MATCH0–MATCHn) are commonly coupled to the modified CAM cells (702(0,0) to 702(0,m)) of the same row. In the event a stored data word does not match an applied comparand value, the match line of the data word will be driven low. In the event a stored data word matches an applied comparand value, the match line of the data word will remain at a high, precharged level.

The schematic diagram of FIG. 7 can be considered "simplified" in that the figure omits word lines and bit line pairs to avoid unduly cluttering the view. Accordingly, it is understood that the modified CAM cells of the same column (e.g., 702(0,0) to 702(n,0)) are commonly coupled to a pair of complementary bit lines (not shown), and the memory cells of the same row (e.g., 702(0,0) to 702(0,m)) are commonly coupled to a word line (not shown).

The modified CAM cells (702(0,0) to 702(n,m)) of the preferred embodiment 700 differ from those of conventional binary and ternary CAMs. In a conventional binary CAM, each CAM cell includes a data storage register and a compare circuit. In a conventional ternary CAM, each CAM cell includes a data register, a compare circuit, a mask register, and a mask circuit. In the preferred embodiment 700, each modified CAM cell (702(0,0) to 702(n,m)) includes a data storage register, a compare circuit, and a multiplexer circuit. In the particular view of FIG. 7, the data storage register and compare circuit are shown as a single store/compare circuit (704(0,0) to 704(n,m)). The multiplexer circuits of each modified CAM cell are shown as (706(0,0) to 706(n,m)).

The multiplexer circuit (706(0,0) to 706(n,m)) of each modified CAM cell (702(0,0) to 702(n,m)) couples a comparand value from a previous data word to the store/compare circuit (704(0,0) to 706(n,m)) of the cell. The comparand value can be from the CAM cell of the same column within the previous data word, or from one column to the left. This "shifting" of the comparand value is accomplished by a shift value register (708-0 to 708-n) associated with each data word. In the preferred embodiment 700, when a shift value register (708-0 to 708-n) stores logic "0" value, a comparand value is not shifted as it is coupled from one data word to a subsequent data word. When a shift value register (708-0 to 708n) stores a logic "1" value, a comparand value is shifted by one bit to the right as it is coupled from one data word to a subsequent data word. It is further noted that the multiplexer circuits of the first column 706(0,0), 706(1,0), 706(2,0) . . . 706(n,0)) receive a logic "0" as one input value. Thus, in the shift case, the first column multiplexer circuits (706(0,0), 706(1,0), 706(2,0) . . . 706(n,0)) will couple a logic 0 value to their respective store/compare circuit (704(0,0), 704(1,0), 704(2,0) . . . 704(n,0)).

Referring once again to FIG. 7, the modified binary CAM 700 is shown to include a comparand word register 710 that includes a comparand bit register (710-0 to 710-m) for each column of the modified CAM 700. A value for comparison (such a prefix in a network look-up function application) is loaded into the comparand word register 710. The value can then be compared to each data word within the modified CAM 700 by operation of the multiplexer circuits 706(0,0) to 706(n,m)). It is noted that the preferred embodiment 700 can include bit mask circuits associated with each column of the modified CAM. Such circuits would force the modified CAM cells of the same column to a "match" state.

Also included within FIG. 7 is a priority encoder circuit 714. The priority encoder circuit 714 will determine which match case prevails in the event there is more than one match for an applied comparand value.

Figure 8A:
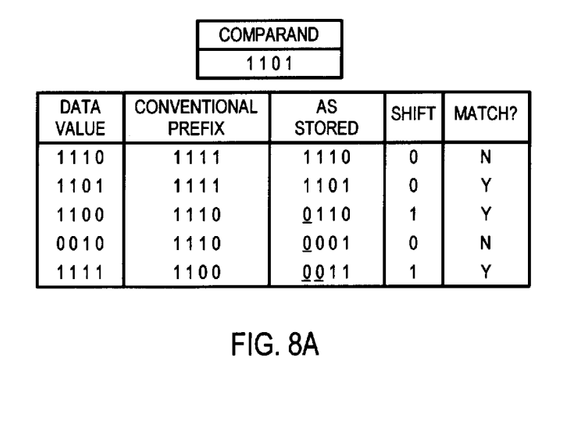
FIGS. 8A–8D are block schematic diagrams and tables illustrating the operation of the preferred embodiment.
Figure 8B:
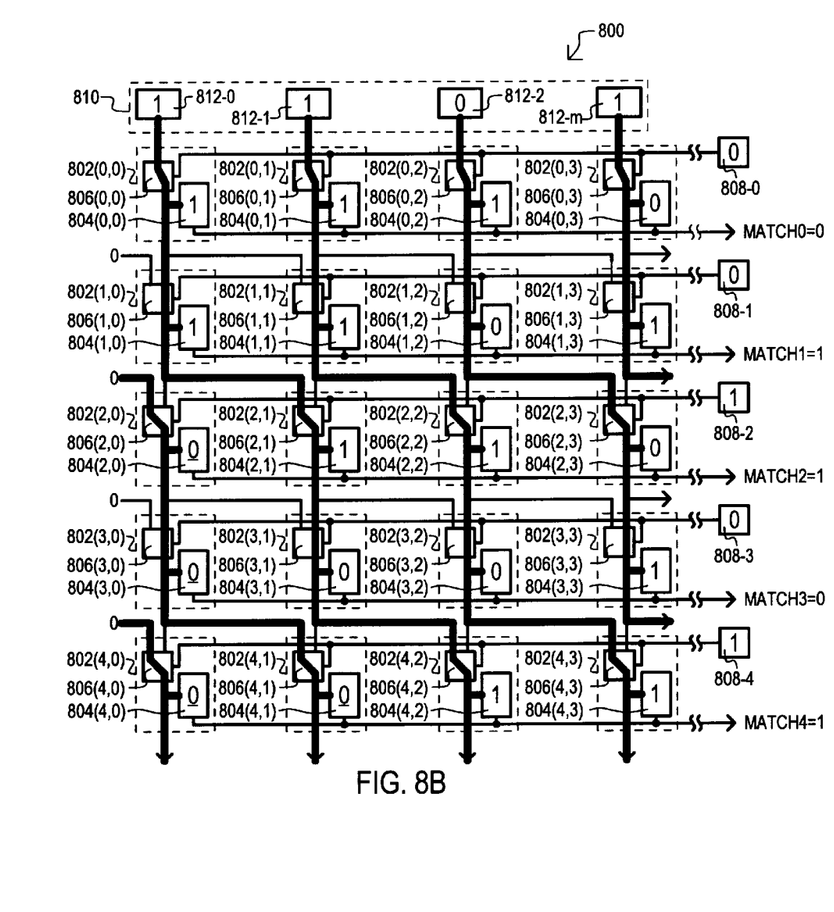
Figure 8C:
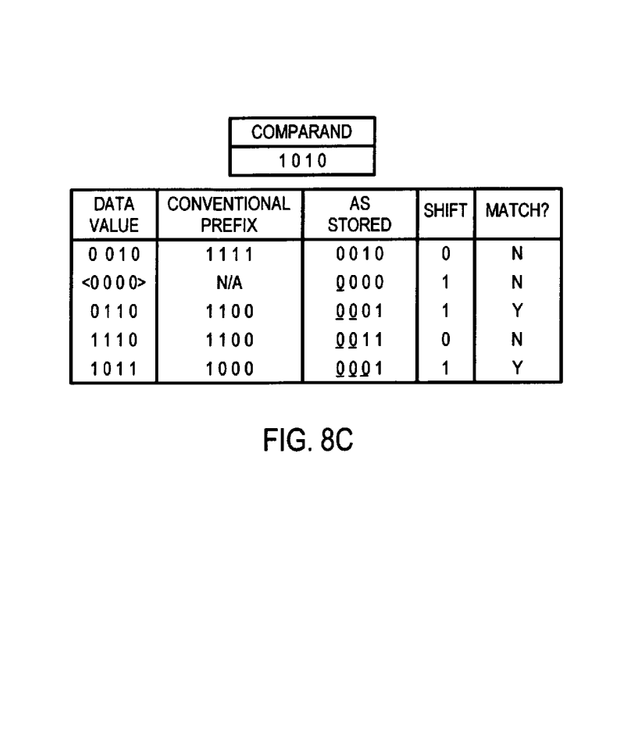
Figure 8D:
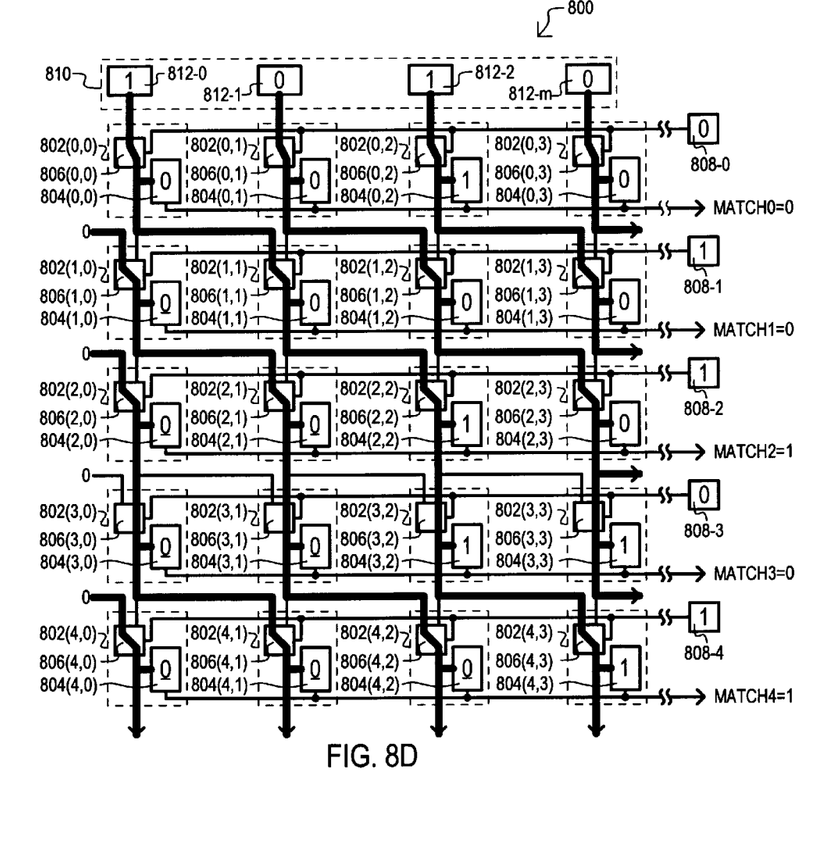

Having described the general circuit constituents of the preferred embodiment 700, the operation of the preferred embodiment 700 will now be described in a pair of block schematic diagrams and tables. FIGS. 8A and 8B set forth a table and a block schematic diagram that illustrate one set of stored data values and one comparand value. FIGS. 8C and 8D are a table and a block schematic diagram that illustrate a second set of stored data values and a second comparand. The block schematic diagram of FIGS. 8B and 8D are similar views to that as FIG. 7, but illustrate the flow of comparand data through each multiplexer circuit 706(0,0) to 706(n,m)). Furthermore, unlike FIG. 7, which is intended to illustrate the entire modified CAM array, the views of FIGS. 8B and 8D set forth the first five rows and first four columns of the modified CAM. The priority encoder is also omitted.

FIG. 8A is a table that describes one particular example of a comparand value and data values for the preferred embodiment. The applied comparand value is shown to be the binary value "1101." The data values stored within the modified CAM are set forth in one column labeled DATA VALUE. In an adjacent column, conventional prefix values are provided for each data value. Thus, the first data value is "1110" and has a prefix value of "1111." This means that all four bits of the data value are to be compared with the comparand value. In contrast, the fifth data value is "1111" and has a prefix value of "1100. " Thus, in this latter case, only the first two bits of the data value are to be compared with the comparand value. It is noted that the preferred embodiment does not store prefix values, thereby providing a much more compact arrangement than a conventional ternary CAM. The prefix values are provided in FIG. 8A for reference, to indicate which bits of a data value are prefix bits.

A third column (AS STORED) is provided in FIG. 8A that illustrates how the data values are stored within the modified CAM of the preferred embodiment. Data values are shifted to the right as they are stored according to how many bits of a data word serve as a prefix. Viewed a different way, data values are shifted right for each logic 0 in the corresponding prefix value. Thus, because all the bits of the first two data values (1110 and 1101) are prefix values, these values are not shifted. The subsequent two data values (1100 and 0010) have one zero in their prefix values, and so are shifted by one bit to the right. It is noted that the far left bit (the first bit entry) is set to a logic 0. For clarification, this leading zero is distinguished from a zero in the data value by being underlined. The last data value (1111) has two zeros in its prefix value, and so is shifted to the right by two bits. The resulting empty first two bits are filled with zeros.

The table of FIG. 8A further includes shift values for each stored data word. The shift values indicate when a data word is shifted with respect to a previous data word. Thus, the second data word (1101) is not shifted with respect to the first data word (1110), and so its shift value is a logic "0." The third data word (1100) is shifted with respect to the second data word (1101), and so has a shift value of 1. The first shift value in the modified CAM will always have a logic 0 value, as there is no corresponding previous data value.

Finally, FIG. 8A includes a match indication that indicates whether or not the applied comparand value (1101) will result in a match indication with the prefix of the stored data words.

The operation of the preferred embodiment in response to the values set forth in FIG. 8A will now be described in conjunction with FIG. 8B. FIG. 8B includes the same general circuits as set forth in FIG. 7. Thus, like items will be referred to by the same reference character, but with the first number being an "8" instead of a "7."

Unlike FIG. 7, FIG. 8B illustrates the data values stored within various portions of modified CAM 800. For example, the various bits of the stored comparand value (1110) are shown in their corresponding comparand bit registers (812-0 to 812-3). The data values as stored by the modified CAM cells (802(0,0) to 802(n,m)) are also shown. For example, the first four bits of the first data word are illustrated by showing a logic 1 value in modified CAM cell 802(0,0), a logic 1 in modified CAM cell 802(0,1), a logic 1 in modified CAM cell 802(0,2) and a logic 0 in modified CAM cell 802(0,3). For those data entries that have a logic 0 value inserted in the initial bit locations, the logic 0 value is underlined in the figure. Thus, in the particular example of FIG. 8B, modified CAM cells 802(2,0), 802(3,0), 802(4,0), and 802(3,1) are shown to include underlined logic 0 values. The shift values corresponding to each stored data word are also shown in their corresponding shift value register (808-0 to 808-4). Thus, corresponding to the SHIFT column of FIG. 8A, shift value registers (808-0 to 808-4) store shift values 0, 0, 1, 0 and 1, respectively.

In operation, once the shift values and data values (with appropriate right shifts and initial zeros) are loaded into the modified CAM 800, the comparand value can be applied to the stored data values. In the block schematic diagram of FIG. 8B, the flow of the comparand value through the array is shown by bold lines. Referring now to FIG. 8B, initially, the comparand value (1101) is applied to the first data value (1110). As noted above, the shift value for the initial data word is always zero, thus, the comparand value is not shifted as it is applied to the first data value. Because the four-bit comparand value and four-bit first data value are different, the corresponding match signal MATCH0 is equal to a logic 0, indicating a "no match" case.

The shift value of the second data value (1101) is a logic 0. This indicates that all four bits are to be compared with the comparand value. In essence, the first logic value can be considered to have a "compare" portion that is four bits long. Thus, the comparand value (1101) is not shifted as it is applied to the second data value (1101). Because the four-bit comparand value and four-bit second data value are the same, the corresponding match signal MATCH1 is equal to a logic 1, indicating a "match" case.

The shift value of the third data value (1110) is a logic 1. This indicates only the first three bits (111) of the third data value are to be compared with the comparand value (i.e., the third data value has a compare portion that is three bits long). The logic 1 value stored in shift value register 808-2 results in the multiplexer circuits (806(2,0) to 806(2,3)) within the modified CAM cells (802(2,0) to 802(2,3)) shifting the comparand value as it is applied to the third data value. Furthermore, multiplexer circuit 806(2,0), due to the shift operation, will apply a logic 0 value to the store/compare circuit 804(2,0). Thus, once shifted, the shifted comparand value (0110) will be applied to the shifted third data value (0110). The result is a match indication between the first three bits of the comparand value (110) and the first three bits of the third data value (110). The match signal corresponding to the third data value will be high (MATCH2= logic 1).

The shift value of the fourth data value (0010) is a logic 0. This indicates that the fourth data value will be compared to the comparand value in the same fashion as the third data value. Said in another way, like the third data value, the first three bits of the fourth data value are to be compared with the first three bits of the comparand value. The multiplexer circuits (806(3,0) to 806(3,3)) of the fourth data word do not shift the comparand value as it is applied to the fourth data value. Thus, the shifted comparand value (0110) will be applied to the fourth data value as stored (0001). Because the first three comparand values (110) are different than the first three values of the fourth data value (001) there is no match, and the MATCH3 value will be a logic 0.

The shift value corresponding to the fifth data value (1111) is a logic 1. This indicates that only the first two bits (11) of the fifth data value are to be compared with the comparand value. The logic 1 value stored in shift value register 808-4 results in the multiplexer circuits (806(4,0) to 806(4,3)) within the modified CAM cells (802(4,0) to 802(4,3)) shifting the comparand value as it is applied to the fifth data value. Furthermore, multiplexer circuit 806(4,0), due to the shift operation, will apply another leading logic 0 value to the store/compare circuit 804(4,0). Thus, once shifted, the (now) twice shifted comparand value (0011) will be applied to the shifted third data value (0011). The result is a match indication between the first two bits of the comparand value (11) and the first two bits of the fifth data value (11) (MATCH4=logic 1).

In this manner, data values are shifted when they are loaded into the modified CAM 800. When a compare operation is to take place, the comparand value is correspondingly shifted as it is simultaneously applied to the stored data values.

FIG. 8C describes a second comparand value and second set of data values for the preferred embodiment. These second set of values are provided to illustrate how "dummy" entries are used when one data value has a prefix that is shorter than a previous data value prefix by more than one bit. The table of FIG. 8C sets forth the same columns as that of FIG. 8A, including a DATA VALUE column, a CONVENTIONAL PREFIX column, an AS STORED column, a SHIFT value column, and a MATCH indication column.

FIG. 8C represents only four true data values, and the second data value, shown as <0000> is a "dummy" data value. The dummy data value performs two functions. First, it provides a shift indication, and thus introduces a shift into the comparand value as it is applied to the various data values of the array. Second, the dummy value provides a no match indication. It is understood that the dummy value is shown as 0000, but is not limited to any particular value. All that is required is that the data location that stores the dummy value does not provide a match indication.

The dummy value is used when the compare portion (prefix, in the case of FIGS. 8C and 8D) of one data value is shorter than the compare portion of a previous data value by more than one bit. In particular, referring once again to the table of FIG. 8C, it is shown that all four data bits of the first data value (0010) are to be compared (indicated by the conventional prefix value of 1111) with a comparand value. However, the next standard (i.e., non-dummy) value (0110) has only a two-bit prefix (indicated by the conventional prefix value of 1100). Thus, the comparand value must be shifted twice to the right before it is applied to the second standard data value (0110). Accordingly, the dummy value is entered to introduce one of the necessary shifts. The second shift will be provided by modified CAM cells that store the second standard data value (0110).

Referring now to FIG. 8D, a block schematic diagram is set forth illustrating the same general view of FIG. 8B, but with the second set of data values, the second comparand value, and the second shift values.

As shown in FIG. 8D, the initial shift value is a logic 0. The four bit comparand value (1010) is applied to the first data value (0010), resulting in a no match indication (MATCH0=0). The shift value corresponding to the second (dummy) data value is a logic 1 (all dummy values with have such a shift value). The comparand value is thus shifted to the right by one bit as it is applied to the dummy value. The dummy value will cause a no match indication (MATCH1= 0). It is noted that this no match indication does not have to rely on differences between the stored dummy data value. Other circuitry could be employed to force match indications for dummy data words to always indicate a no match case.

The shift value corresponding to the third data value (0110) is a logic 1, indicating that the first two bits of the data value (10) are to be compared with the first two bits of the comparand value (10). Thus, the comparand value is shifted once again, resulting in the (twice) shifted comparand value (0010) being compared with the third data value as stored (0010). The result is the MATCH2 signal being a logic 1. The shift value corresponding to the fourth data value (1110) is a logic 0, resulting in the (twice) shifted comparand value (0010) being compared with the fourth data value as stored (0011). A no match results, causing the MATCH3 value to be a logic 0. The shift value corresponding to the fifth data value (1011) is a logic 1, resulting in the (twice) shifted comparand value (0010) being shifted once again, to generate a (thrice) shifted comparand value (0001). This value is compared with the fifth data value as stored (0001), resulting in MATCH4 being a logic 1.

In this manner, dummy entries that introduce a shift into the comparand value can be used when one data value has a compare portion that is shorter than a previous data value compare portion by more than one bit.

It is understood that FIGS. 8A to 8D illustrate a four-bit comparison arrangement. Of course, it is understood that much longer comparison arrangements are possible. As just one example, a 32-bit comparison may be particularly advantageous in some applications. Accordingly, the preferred embodiment of FIGS. 7 and 8A to 8D should not be construed as limiting the invention thereto.

Figure 9:
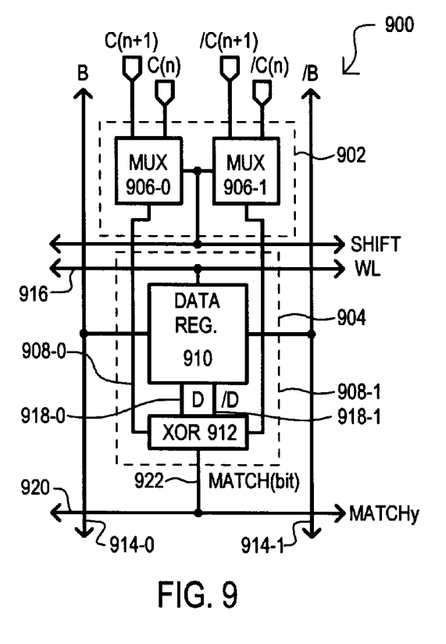
FIG. 9 is a block diagram of a modified CAM cell according to the preferred embodiment.

Having described the preferred embodiment in terms of block schematic diagrams and tables, a modified CAM cell according to the preferred embodiment will now be described. Referring now to FIG. 9, a modified CAM cell is set forth, designated by the general reference character 900. The modified CAM cell 900 is shown to include a multiplexer circuit 902 and a store/compare circuit 904. The multiplexer circuit 902 of the particular arrangement of FIG. 9 is shown to include a first multiplexer (MUX) 906-0 and a second MUX 906-1. The first MUX 906-0 receives a non-shifted comparand value C(n) and a shifted comparand value C(n+1) as inputs. The first MUX 906-0 is controlled by a SHIFT signal. Depending upon the value of the SHIFT signal, the first MUX 906-0 will provide either the C(n) or C(n+1) value as a first MUX output 908-0. In the particular embodiment of FIG. 9, when the SHIFT signal is high, the C(n+1) signal will be provided as an output. When the SHIFT signal is low, the C(n) signal will be provided as an output. In the event the first MUX 908-0 is part of a left-most modified CAM cell (such as modified CAM cell 702(0,0) of FIG. 7), the C(n+1) value will be a logic "0." The second MUX 908-1 is similar to the first MUX 908-1, but provides complementary comparand values /C(n) and /C(n+1)

according to the SHIFT signal. When the SHIFT signal is low, the /C(n) signal will be provided as an output. When the SHIFT signal is high, the /C(n+1) signal will be provided as an output. In the case of a left-most modified CAM cell, the /C(n+1) value will be a logic "1."

The store/compare circuit 904 includes a data storage register 910 and a compare circuit 912. The data storage register 910 is situated between complementary bit lines 914-0 and 914-1. Access to the data storage register 910 is accomplished by the activation of a word line 916. When the word line 916 is driven high, data values can be written into, or read from the data storage register 910 by way of bit lines 914-0/914-1. The data value stored within the data storage register 910 is provided on complementary data lines 918-0 and 918-1 to the compare circuit 912.

The compare circuit 912 of the particular embodiment of FIG. 9 functions as an exclusive OR circuit, and compares the comparand values from the multiplexer circuit 902 to the data values (D and /D) from the data storage register 910. In the event the SHIFT signal is high (logic 1), the data values (D and /D) will be compared with the shifted comparand values (C(n+1) and /C(n+1)). If SHIFT is low (logic 0) the data values (D and /D) will be compared with the non-shifted comparand values (C(n) and /C(n)). The result of the comparison operation of the compare circuit 912 is provided to a word match line (MATCHy) 920 by way of compare circuit output 922.

In the preferred embodiment modified CAM cell 900, the data storage register 910 may take the form of the register circuit 200 set forth in FIG. 2. Along these same lines, the compare circuit 912 may take the form of the compare circuit 300 of FIG. 3.

Figure 10:
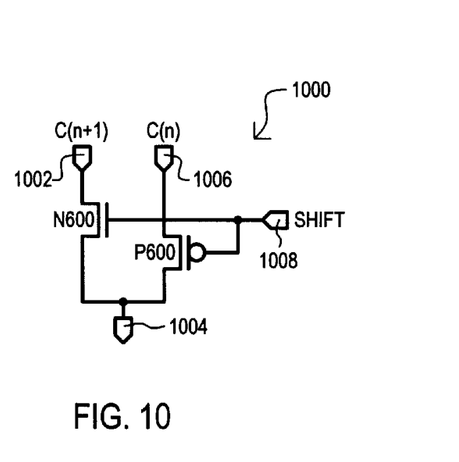
FIG. 10 is a detailed schematic diagram of a multiplexer that may be used in the preferred embodiment modified CAM cell.

The first and second MUXs (906-0 and 906-1) may take the form of the MUX set forth in FIG. 10. The MUX of FIG. 10 is designated by the general reference character 1000 and is shown to include an n-channel metal(conductor)-oxide(insulator)-semiconductor (MOS) transistor N1000 having a source-drain path coupled between a first input 1002 and a MUX output 1004. In addition, a p-channel MOS transistor P1000 is provided that has a source-drain path coupled between a second input 1006 and the MUX output 1004. The gates of transistors N1000 and P1000 both receive the SHIFT signal from a control input 1008. Thus, when the SHIFT signal is low, a low impedance path is provided by transistor P1000, allowing a non-shifted comparand value to be coupled from the second input 1006 to the MUX output 1004. Conversely, when the SHIFT signal is high, a low impedance path is provided by transistor N1000, allowing a shifted comparand value to be coupled from the first input 1002 to the MUX output 1004. In this manner, the SHIFT signal is applied as a control signal for the MUX 1000.

The MUX 1000 set forth in FIG. 10 is particularly advantageous as it includes only two transistors, and so is a compact structure. In addition, the CMOS arrangement allows full logic swings to be coupled from the first and second inputs (1002 and 1006) to the MUX output 1004.

The preferred embodiment CAM cell 900 has been described as being capable of utilizing the register circuit 200 of FIG. 2, the compare circuit 300 of FIG. 3, and the multiplexer 1000 of FIG. 10. These complementary MOS (CMOS) structure are particularly advantageous in terms of reducing power consumption and providing full logic swings in voltage. Such particular circuits should not be construed as limiting the invention, however, as they represent but one particular preferred embodiment implementation.

It is noted that the preferred embodiment modified CAM cell can perform a longest prefix matching function, but only requires fourteen transistors per cell. This is in sharp contrast to conventional ternary CAM cells that require seventeen transistors per cell. Because the preferred embodiment modified CAM can include an array of thousands of modified CAM cells (i.e., have 64-bits per row with hundreds of rows) the area savings provided by the smaller CAM are considerable, resulting in a more cost effective solution to the longest prefix matching problem. Furthermore, because the modified CAM is not a custom made device, like an ASIC, it can be less costly to implement.

While the preferred embodiments set forth herein have been described in detail, it should be understood that the present invention could be subject various changes, substitutions, and alterations without departing from the spirit and scope of the invention. Accordingly, the present invention is intended to be limited only as defined by the appended claims.

What is claimed is:

1. In a content addressable memory (CAM) device that includes an array of CAM cells, a content addressable memory cell, comprising:
    a storage register that stores at least one data value;
    a compare circuit coupled to the storage register, having a data input and a comparand input, the compare circuit comparing the value at the data input to the value at the comparand input and generating a match indication when the values are the same; and
    a multiplexer (MUX) circuit coupled to the compare circuit, that receives a MUX circuit control signal and includes a first MUX circuit input and a second MUX circuit input, the MUX circuit coupling the first MUX circuit input to a first MUX circuit output when the control signal has a first value, and coupling the second MUX circuit input to the first MUX circuit output when the control signal has a second value, the first MUX circuit output being coupled to the comparand input of the compare circuit.

2. The CAM cell of claim 1, wherein:
    the storage register includes a first inverter and a second inverter,
        the first inverter having an input coupled to a data node, and an output coupled to the input of the second inverter, and
        the second inverter having an output coupled to the input of the first inverter.

3. The CAM cell of claim 1, wherein:
    the storage register is coupled to a word line, and accessed by the activation of the word line.

4. The CAM cell of claim 3, wherein:
    the storage register is coupled to at least one bit line by the source-drain path of at least one pass insulated gate field effect transistor (IGFET), the pass IGFET having a gate coupled to the word line.

5. The CAM cell of claim 1, wherein:
    the compare circuit includes an exclusive OR circuit.

6. The CAM cell of claim 1, wherein:
    the MUX circuit includes
        a first multiplexer having
            a first IGFET with a source-drain path coupled between the first MUX circuit input and the first MUX circuit output, and
            a second IGFET with a source-drain path coupled between the second MUX circuit input and the first MUX circuit output.

7. The CAM cell of claim 1, wherein:
the first MUX circuit input receives a comparand value and the second MUX circuit input receives a shifted comparand value; and
the MUX circuit further includes
a third MUX circuit input that receives a complementary comparand value,
a fourth MUX circuit input that receives a complementary shifted comparand value, and
a second MUX circuit output.

8. The CAM cell of claim 7, wherein:
the multiplexer circuit further includes
a second multiplexer having
a third IGFET with a source-drain path coupled between the third MUX circuit input and the second MUX circuit output, and
a fourth IGFET having a source-drain path coupled between the fourth MUX circuit input and the second MUX circuit output.

9. A content addressable memory (CAM), comprising:
a plurality of CAM cells arranged into columns and rows,
the columns being arranged in the row direction in a consecutive order so that substantially every column includes a previous column and a subsequent column,
the rows being arranged in the column direction in a consecutive order so that substantially every row includes a previous row and a subsequent row,
each CAM cell including
a storage circuit that stores a data value,
a multiplexer (MUX) circuit that receives a shifted comparand value from the CAM cell of a previous row and previous column and a non-shifted comparand value from the previous row and the same column, the MUX circuit providing the shifted comparand value as a MUX circuit output or the non-shifted comparand value as the MUX circuit output according to a shift value associated with the row of the CAM cells, and
a compare circuit that compares the data value to the MUX circuit output.

10. The CAM of claim 9, wherein:
the plurality of CAM cells further includes a first column of CAM cells, each CAM cell of the first column including
a storage circuit that stores a data value,
a multiplexer (MUX) circuit that receives a predetermined logic value as one input and a non-shifted comparand value from the previous row and the same column as a second input, the MUX circuit providing the predetermined logic value as a MUX circuit output or the non-shifted comparand value as the MUX circuit output according to the shift value associated with the row of the CAM cells, and
a compare circuit that compares the data value to the MUX circuit output.

11. The CAM of claim 9, further including:
a comparand word register for storing a comparand word value; and
the plurality of CAM cells further includes a first row of CAM cells, each CAM cell of the first row including
a storage circuit that stores a data value,
a multiplexer (MUX) circuit that receives a non-shifted comparand value from the comparand word register, and
a compare circuit that compares the data value to the non-shifted comparand value.

12. The CAM of claim 9, further including:
a shift value register associated with each row of CAM cells, each shift value register storing the shift value associated with each row.

13. The CAM of claim 12, wherein:
the MUX circuits of the CAM cells of the same row are commonly coupled to the shift value register associated with the row.

14. The CAM of claim 9, wherein:
the compare circuit of the CAM cells of the same row are commonly coupled to a match line.

15. In a content addressable memory (CAM) that receives a comparand word value and stores a number of data values, each data value having a compare portion, a method of providing rapid comparison between the comparand word value and variable length compare portions, the method comprising the steps of:
storing the data values in an order according to compare portion size, with the data values having the largest compare portions preceding those with smaller compare portions;
shifting a data value in a predetermined direction when the data value has a compare portion length that is less than a previous compare portion length;
providing a shift indication for a data value when it is shifted;
comparing the comparand value to the first data value in the order;
shifting the comparand value before it is applied to subsequent data values if the subsequent data values include a shift indication; and
comparing the comparand value to the subsequent data values.

16. The method of claim 15, wherein:
the CAM includes a plurality of CAM cells arranged into rows and columns;
the data values each include a number of data bits; and
the step of storing the data values in an order includes storing a data values in a corresponding row of CAM cells, with one bit being stored in one of the CAM cells.

17. The method of claim 16, wherein:
the step of shifting a data value includes storing a data value in a row of CAM cells, the data value being offset in the column direction with respect to the previously stored data value.

18. The method of claim 16, wherein:
the step of shifting a data value results in a row of CAM cells having vacant CAM cells that do not store data value data bits; and
the step of shifting a data value further includes placing predetermined logic values in the vacant CAM cells.

19. The method of claim 15, wherein:
the step of storing the data values in the order further includes
storing a dummy data value in the order when a preceding data value has a compare portion length greater than a subsequent compare portion length by more than one bit, and
providing a shift indication for the dummy data value.

20. The method of claim 15, further including:
the step of activating a match indication associated with a data value when the comparand value matches the compare portion of the data value.

* * * * *